US009406615B2

(12) United States Patent
Jezewski et al.

(10) Patent No.: US 9,406,615 B2
(45) Date of Patent: Aug. 2, 2016

(54) TECHNIQUES FOR FORMING INTERCONNECTS IN POROUS DIELECTRIC MATERIALS

(71) Applicant: INTEL CORPORATION, Santa Clara, CA (US)

(72) Inventors: Christopher J. Jezewski, Hillsboro, OR (US); David J. Michalak, Portland, OR (US); Kanwal Jit Singh, Portland, OR (US); Alan M. Myers, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 148 days.

(21) Appl. No.: 14/139,970

(22) Filed: Dec. 24, 2013

(65) Prior Publication Data
US 2015/0179578 A1 Jun. 25, 2015

(51) Int. Cl.
*H01L 23/48* (2006.01)
*H01L 23/532* (2006.01)
*H01L 21/768* (2006.01)

(52) U.S. Cl.
CPC ...... *H01L 23/5329* (2013.01); *H01L 21/76802* (2013.01); *H01L 21/76838* (2013.01); *H01L 23/53257* (2013.01); *H01L 23/53295* (2013.01); *H01L 23/53223* (2013.01); *H01L 23/53238* (2013.01); *H01L 23/53266* (2013.01); *H01L 2924/0002* (2013.01)

(58) Field of Classification Search
CPC ...... H01L 23/5329; H01L 23/53257; H01L 21/76802; H01L 21/76838
USPC ............................................. 257/768; 438/641
See application file for complete search history.

(56) References Cited

U.S. PATENT DOCUMENTS

| 7,842,518 B2 * | 11/2010 | Miyajima ...................... 438/4 |
| 9,269,652 B2 | 2/2016 | Michalak et al. |
| 2005/0266698 A1 * | 12/2005 | Cooney et al. ............ 438/765 |

(Continued)

OTHER PUBLICATIONS

Taiwan Office Action including Taiwan IPO Search Report received in Taiwan Patent Application No. 103139773, dated Dec. 28, 2015, 11 pages.

*Primary Examiner* — Trung Q Dang
(74) *Attorney, Agent, or Firm* — Finch & Maloney PLLC

(57) ABSTRACT

Techniques are disclosed for forming interconnects in porous dielectric materials. In accordance with some embodiments, the porosity of a host dielectric layer may be reduced temporarily by stuffing its pores with a sacrificial pore-stuffing material, such as titanium nitride (TiN), titanium dioxide ($TiO_2$), or other suitable sacrificial material having a high etch selectivity compared to the metallization and dielectric material of the interconnect. After interconnect formation within the stuffed dielectric layer, the sacrificial pore-stuffing material can be removed from the pores of the host dielectric. In some cases, removal and curing can be performed with minimal or otherwise negligible effect on the dielectric constant (κ-value), leakage performance, and/or time-dependent dielectric breakdown (TDDB) properties of the host dielectric layer. Some embodiments can be utilized, for example, in processes involving atomic layer deposition (ALD)-based and/or chemical vapor deposition (CVD)-based backend metallization of highly porous, ultra-low-κ (ULK) dielectric materials.

25 Claims, 5 Drawing Sheets

(56) References Cited

U.S. PATENT DOCUMENTS

2006/0046472 A1* 3/2006 Sandhu et al. ............... 438/653
2010/0102452 A1* 4/2010 Nakao ........................ 257/773
2012/0025395 A1* 2/2012 Chikaki et al. ............... 257/774
2013/0017688 A1* 1/2013 Dubois ............... H01L 21/3105
 438/759
2013/0320520 A1 12/2013 Michalak et al.

* cited by examiner

TECHNIQUES FOR FORMING INTERCONNECTS IN POROUS DIELECTRIC MATERIALS

BACKGROUND

Integrated circuit design in the deep-submicron process nodes (e.g., 32 nm and beyond) involves a number of non-trivial challenges, and particular complications have been faced with respect to integration of highly porous dielectric materials. Continued process scaling will tend to exacerbate such problems.

Figure 1:
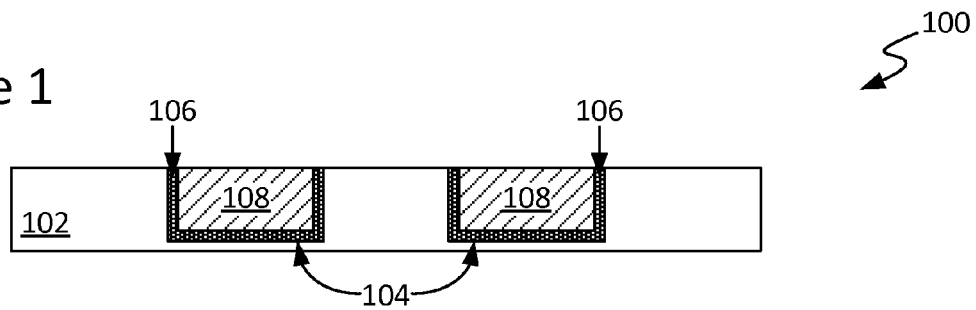
FIG. 1 is a cross-sectional view of an interconnect layer of an integrated circuit (IC) provided with lower-layer metallization, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topography or otherwise be non-smooth, given real world limitations of fabrication processes. In short, the figures are provided merely to show example structures.

DETAILED DESCRIPTION

Techniques are disclosed for forming interconnects in porous dielectric materials. In accordance with some embodiments, the porosity of a host dielectric layer may be reduced temporarily, for example, by stuffing its pores with a sacrificial pore-stuffing material, such as titanium nitride (TiN), titanium dioxide ($TiO_2$), or other suitable sacrificial material having a high etch selectivity compared to the metallization and dielectric material of the interconnect, as will be apparent in light of this disclosure. After forming a desired quantity of interconnects within the stuffed dielectric layer, the sacrificial pore-stuffing material can be removed, at least partially (e.g., nearly completely), from the pores of the host dielectric layer. In some cases, removal and curing of the sacrificial pore-stuffing material can be performed with minimal or otherwise negligible effect, for example, on the dielectric constant (κ-value), leakage performance, and/or time-dependent dielectric breakdown (TDDB) properties of the host dielectric layer. Some embodiments can be utilized, for example, in processes involving atomic layer deposition (ALD)-based and/or chemical vapor deposition (CVD)-based backend metallization of highly porous, ultra-low-κ (ULK) dielectric materials. Numerous configurations and variations will be apparent in light of this disclosure.

General Overview

Interconnects continue to scale smaller in size and faster in speed, giving rise to many issues. One such issue deals with reducing the impact of dimensionally induced resistor-capacitor (RC) circuit delay. To that end, porosity can be introduced to inter-layer dielectric (ILD) materials used with back end of line (BEOL) interconnect structures to provide dielectric capacitance improvements in an effort to reduce RC delay. However, the introduction of porosity to the ILD layers may result in a reduction in mechanical strength and susceptibility of those layers to penetration by chemicals and plasmas utilized in circuit fabrication processes. For example, during some processes utilized in IC metallization, such as dry etching, wet etching, wet chemical cleans, chemical mechanical planarization (CMP), chemical vapor deposition (CVD), plasma-enhanced CVD (PECVD), and atomic layer deposition (ALD), the porous ILD material may be exposed to gaseous or liquid precursors that can infiltrate and degrade the dielectric layers.

Thus, and in accordance with some embodiments of the present disclosure, techniques are disclosed for forming interconnects in porous dielectric materials. In accordance with some embodiments, prior to forming a given interconnect, the porosity of a host dielectric layer may be reduced temporarily, for example, by stuffing its pores with titanium nitride (TiN), titanium dioxide ($TiO_2$), or other suitable sacrificial pore-stuffing material having a high etch selectivity compared to metallization and dielectric material of the interconnect. After forming the desired quantity of interconnects within the stuffed dielectric layer, the sacrificial pore-stuffing material can be removed from the pores of the host dielectric layer. As discussed herein, after removal, trace amounts of one or more constituent components of the pore-stuffing material may remain within the pores of the dielectric layer. Nonetheless, in some cases, removal and curing of the pore-stuffing material can be performed with minimal or otherwise negligible effect, for example, on the dielectric constant (κ-value), leakage performance, and/or time-dependent dielectric breakdown (TDDB) properties of the host dielectric layer.

Some embodiments can be utilized, for example, in back-end metallization processes for forming interconnects in highly porous, ultra-low-κ (ULK) dielectric materials. Some embodiments may help to improve the compatibility of such porous ULK dielectric layers, for example, with ALD-based and/or CVD-based metallization processes. Some embodiments may be utilized, for example, with dielectric materials having a porosity that is greater than or equal to about 25% by volume. Also, in accordance with some embodiments, the selected pore-stuffing material may help to improve the mechanical properties of the host dielectric layer, thereby improving its robustness against damage during integrated processing (e.g., during patterning and etch/clean processing). For example, in some cases, the pore-stuffing material may help to reduce dielectric line wiggle after trench or related etching. In some instances, the selected stuffing material may help to increase stability to chemical-mechanical planarization (CMP). Furthermore, in accordance with some embodiments, the selected pore-stuffing material may help to prevent or otherwise reduce penetration into the host dielectric layer of liquid and/or gaseous precursor materials used, for example, during dry etching, wet etching, wet chemical cleans, CMP, CVD, PECVD, and/or ALD metallization processes.

As previously noted, some embodiments may utilize a titanium nitride (TiN)-based or titanium dioxide ($TiO_2$)-based pore-stuffing material. In some instances, the rigidity and relatively high Young's modulus of TiN or $TiO_2$ may help, for example, to provide structural stability against pattern wiggle and/or collapse (e.g., after wet clean on etched trench or related patterns). Also, in some instances, TiN may be compatible, for example, with high-temperature integration processes, as a result of its being a refractory material with relatively high thermal stability. Furthermore, in some cases, the general compatibility of TiN, for example, with existing etch and patterning processes may be exploited to improve process flow integration. For example, in some instances, traditional, compatible wet etch chemistries that are highly selective to TiN can be utilized to remove the TiN-based pore-stuffing material from the pores of a host dielectric material with relative ease, in accordance with some embodiments. In some instances, the etch selectivity of TiN may provide for facile removal and recovery of the host dielectric layer to intended dielectric properties. Additionally, TiN-based pore-stuffing material can be used, for example, in processing nodes in which the trench depth or desired TiN thickness may be sufficiently thin to be transparent to lithography tools, which may help with alignment, in some cases. Other materials having comparable qualities and suitable etch selectivity compared to the metallization and dielectric material of the interconnect can be used as well. Some examples may include titanium dioxide ($TiO_2$), silicon dioxide ($SiO_2$), silicon nitride ($Si_3N_4$), amorphous silicon (a-Si), and tungsten (W). Other suitable metal oxides and metal nitrides will be apparent in light of this disclosure.

As discussed herein, even after removal of the pore-stuffing material from the pores of a host dielectric layer, trace amounts of one or more constituent materials of the selected pore-stuffing material may remain behind, in some instances. For example, in some cases in which a TiN-based pore-stuffing material is utilized, a measurable presence of residual titanium (Ti) may remain within the porous dielectric material even after removal of the pore-stuffing material therefrom. Thus, and in accordance with some embodiments, use of the disclosed techniques may be detected, for example, by visual or other inspection (e.g., microscope, etc.) and/or materials analysis of a given IC or other device that has a porous dielectric layer exhibiting trace amounts of Ti within its pores and hosting one or more interconnect structures configured as described herein. In accordance with some embodiments, detection of the presence of the residual Ti (or other constituent material of the sacrificial pore-stuffing material) may be made, for example, using: energy-dispersive X-ray (EDX) spectroscopy box scans on a transmission electron microscope (TEM); energy-dispersive spectroscopy (EDS) scans on a high-resolution scanning electron microscope (SEM); and/or dynamic or time-of-flight secondary ion mass spectrometry (SIMS; TOFSIMS).

Methodologies

FIGS. 1-13 illustrate an integrated circuit (IC) fabrication process flow, in accordance with some embodiments of the present disclosure. The process may begin as in FIG. 1, which is a cross-sectional view of an interconnect layer of an integrated circuit (IC) 100 provided with lower-layer metallization, in accordance with an embodiment of the present disclosure. As can be seen, IC 100 initially may include an insulator layer 102 having one or more interconnects 108 formed therein. In some cases, insulator layer 102 may host one or more logic devices.

Insulator layer 102 can be formed from any suitable electrically insulating or dielectric material (or combination of such materials). For example, in some embodiments, insulator layer 102 may be formed from: an oxide, such as silicon dioxide ($SiO_2$) or a carbon (C)-doped oxide; a nitride, such as silicon nitride ($Si_3N_4$); a polymer, such as perfluorocyclobutane or polytetrafluoroethylene; a phosphosilicate glass (PSG); a fluorosilicate glass (FSG); an organosilicate glass (OSG), such as silsesquioxane or siloxane, carbosilane material (e.g., methyl- or ethyl-bridged silicates or carbosilane-ringed structures, such as 1,3,5-trisilacyclohexane derivatives); and/or a combination of any one or more thereof. In a more general sense, insulator layer 102 may include any dielectric material (e.g., low-κ dielectric, high-κ dielectric, or otherwise), as desired for a given target application or end-use. Furthermore, the dimensions (e.g., thickness) of insulator layer 102 can be customized, in accordance with some embodiments. Other suitable materials and dimensions for insulator layer 102 will depend on a given application and will be apparent in light of this disclosure.

Also, insulator layer 102 can be formed, for example, on a substrate, wafer, or any other suitable surface using any suitable technique (or combination of techniques). For example, in some embodiments, insulator layer 102 may be formed using: a physical vapor deposition (PVD) process; a chemical vapor deposition (CVD) process, such as plasma-enhanced CVD (PECVD); and/or a spin-on deposition (SOD) process. In accordance with some embodiments, after deposition, insulator layer 102 may undergo one or more curing processes. For example, in accordance with some embodiments, insulator layer 102 may be cured by exposure to a flux of diffuse electrons (e.g., by a flood electron beam). In some other embodiments, curing of insulator layer 102 may be performed, for example, utilizing a flux of ultraviolet (UV) photons and/or infrared (IR) photons. In some still other embodiments, a thermal treatment can be utilized to cure insulator layer 102; for instance, insulator layer 102 can be exposed to a temperature in the range of about 200-450° C. (e.g., about 250-300° C., about 300-350° C., about 350-400° C., or any other sub-range in the range of about 200-450° C.). In some cases, a combination of any of these example curing techniques may be utilized to cure insulator layer 102. Other suitable techniques for forming insulator layer 102 will depend on a given application and will be apparent in light of this disclosure.

As can be seen further, insulator layer 102 may be patterned with one or more openings 104, for example, for formation therein of one or more interconnects 108, in accordance with some embodiments. The one or more openings 104 can be formed using any suitable technique (or combination of techniques). For example, in some embodiments, the one or more openings 104 may be patterned using any suitable lithography techniques, including via/trench patterning and subsequent etch (e.g., wet etch and/or dry etch) processes followed by polishing, cleans, etc., as typically done. Other suitable techniques for forming opening(s) 104 within insulator layer 102 will depend on a given application and will be apparent in light of this disclosure.

Also, the geometry, dimensions, and/or spacing of the one or more openings 104 of insulator layer 102 can be customized. For example, in some embodiments, a given opening 104 may have a generally well-like or trench-like configuration having a substantially rectangular cross-sectional profile (e.g., as can be seen generally from FIG. 1). In some cases, a given opening 104 may be configured as a single-damascene feature (e.g., a trench or via to host a single-damascene interconnect). In some other cases, a given opening 104 may be configured as a dual-damascene feature (e.g., a trench with an underlying via to host a dual-damascene interconnect). In a more general sense, a given opening 104 may be configured to host any isotropic or anisotropic interconnect structure, as desired for a given target application or end-use. Other suitable geometries, dimensions, and spacing for the one or more openings 104 of insulator layer 102 will depend on a given application and will be apparent in light of this disclosure.

In accordance with some embodiments, an optional barrier layer 106 may be formed within a given opening 104 of insulator layer 102. When included, barrier layer 106 may be configured, in accordance with some embodiments, to: (1) limit (e.g., prevent or otherwise reduce) diffusion of the metal(s) of a given interconnect 108 into insulator layer 102; and/or (2) to serve as a seed layer for the metal(s) of a given interconnect 108. To these ends, barrier layer 106 can be formed from any of a wide range of suitable materials. For example, in some embodiments, barrier layer 106 may be formed from: tantalum (Ta); tantalum nitride (TaN); titanium (Ti); titanium nitride (TiN); manganese (Mn); manganese nitride (MnN); molybdenum (Mo); molybdenum nitride (MoN); cobalt tungsten phosphide (CoWP); cobalt tungsten boron (CoWB); and/or a combination of any one or more thereof. As will be appreciated in light of this disclosure, it may be desirable to ensure that barrier layer 106 is formed from material(s) which provide sufficiently high electrical conductivity to maintain suitable electronic contact, for example, with a given overlying interconnect 126a/b (discussed below). Other suitable materials for optional barrier layer 106 will depend on a given application and will be apparent in light of this disclosure.

Also, barrier layer 106 can be formed over IC 100 using any suitable technique (or combination of techniques). For example, in some embodiments, barrier layer 106 may be formed using: a chemical vapor deposition (CVD) process, such as plasma-enhanced CVD (PECVD); and/or an atomic layer deposition (ALD) process. Other suitable techniques for forming barrier layer 106 will depend on a given application and will be apparent in light of this disclosure.

Furthermore, the dimensions of barrier layer 106 can be customized as desired for a given target application or end-use. For example, in some embodiments, barrier layer 106 may have a thickness in the range of about 0.1-40 Å (e.g., about 1-15 Å, about 15-30 Å, or any other sub-range in the range of about 0.1-40 Å). In some instances, barrier layer 106 may have a substantially uniform thickness over the topography provided, for example, by the underlying insulator layer 102 patterned with one or more openings 104. In some instances, barrier layer 106 may be provided as a substantially conformal layer over such topography. In some other instances, barrier layer 106 may be provided with a non-uniform or otherwise varying thickness over such topography. For example, in some cases a first portion of barrier layer 106 may have a thickness within a first range while a second portion thereof has a thickness within a second, different range. In accordance with some embodiments, barrier layer 106 can be provided, for example, as a single layer film or a multi-layer film (e.g., a bi-layer, a tri-layer, etc.), as desired. Other suitable dimensions for barrier layer 106 will depend on a given application and will be apparent in light of this disclosure.

Also, as can be seen from FIG. 1, a given opening 104 of insulator layer 102 may have formed therein an electrical interconnect 108. In some cases, a given interconnect 108 may be formed directly on barrier layer 106, while in some other cases one or more intermediate layers may be provided between a given interconnect 108 and its neighboring barrier layer 106. In accordance with some embodiments, a given interconnect 108 may have any of a wide range of configurations, including, for example: a single-damascene interconnect structure (e.g., a trench; a via); a dual-damascene interconnect structure (e.g., a trench with an underlying via); an anisotropic interconnect structure; and/or an isotropic interconnect structure. Numerous suitable configurations for the one or more interconnects 108 of IC 100 will be apparent in light of this disclosure.

A given interconnect 108 may be formed from any suitable electrically conductive material (or combination of such materials). For example, in some embodiments, a given interconnect 108 may be formed from: copper (Cu); cobalt (Co); molybdenum (Mo); rhodium (Rh); beryllium (Be); chromium (Cr); manganese (Mn); aluminum (Al); ruthenium (Ru); palladium (Pd); tungsten (W); nickel (Ni); cobalt tungsten phosphide (CoWP); cobalt tungsten boron (CoWB); copper germanium (CuGe); silicon (Si); and/or an alloy or other combination of any one or more thereof. Other suitable materials for the one or more interconnects 108 of IC 100 will depend on a given application and will be apparent in light of this disclosure.

Also, a given interconnect 108 may be formed using any suitable technique (or combination of techniques). For example, in some cases, a given interconnect 108 may be formed using: an electroplating process; an electroless deposition process; and/or chemical vapor deposition (CVD) process. Other suitable techniques for forming the one or more interconnects 108 of IC 100 will depend on a given application and will be apparent in light of this disclosure.

Furthermore, the geometry and/or dimensions of a given interconnect 108 of IC 100 can be customized as desired for a given target application or end-use. As will be appreciated in light of this disclosure, the dimensions and geometry of a given interconnect 108 may depend, at least in part, on the configuration of the opening 104 and/or barrier layer 106 (and any additional intermediate layers, if present) associated therewith. Thus, if a given opening 104 of insulator layer 102 is provided with a generally well-like or trench-like configuration having a substantially rectangular cross-sectional profile, then a corresponding interconnect 108 may have a substantially similar profile, in accordance with some embodiments. Other suitable geometries and dimensions for the one or more interconnects 108 of IC 100 will depend on a given application and will be apparent in light of this disclosure.

As will be appreciated in light of this disclosure, it may be desirable in some instances to planarize IC 100 after formation of its one or more interconnects 108 and barrier layer 106. To that end, IC 100 may undergo, for example: a chemical-mechanical planarization (CMP) process; an etch-and-clean process; and/or any other suitable planarization/polish process, as will be apparent in light of this disclosure. In accordance with some embodiments, planarization of IC 100 may be performed, for example, to remove any undesired excess of: (1) a given interconnect 108 (e.g., such as may be present from overfilling a given opening 104 of insulator layer 102 with the interconnect fill metal or metals); and/or (2) barrier layer 106 (e.g., such as may extend over an upper surface topography provided by insulator layer 102 and any neighboring interconnects 108). Other suitable techniques for planarizing IC 100 will depend on a given application and will be apparent in light of this disclosure.

Figure 2:
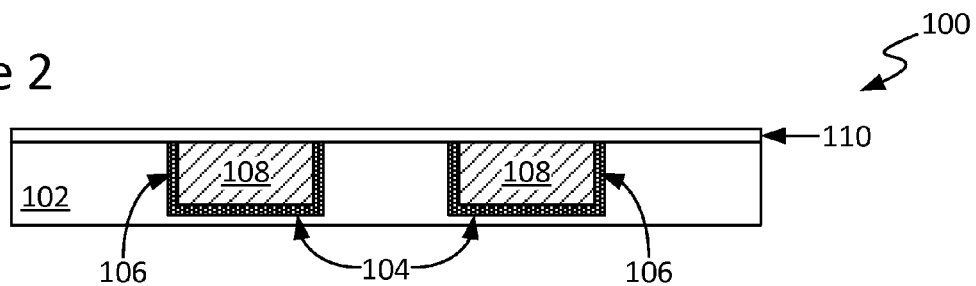
FIG. 2 is a cross-sectional view of the IC of FIG. 1 after formation of a dielectric capping layer, in accordance with an embodiment of the present disclosure.

The process may continue as in FIG. 2, which is a cross-sectional view of the IC 100 of FIG. 1 after formation of a dielectric capping layer 110, in accordance with an embodiment of the present disclosure. Dielectric capping layer 110 may serve, for example, as an etch stop layer (e.g., by virtue of its selective etch properties), a hermetic seal (e.g., to keep water out), and/or an electron migration capping layer for underlying interconnects 108, in accordance with some embodiments. To that end, dielectric capping layer 110 can be formed from any suitable dielectric capping layer material (or combination of such materials), as will be apparent in light of this disclosure. Also, dielectric capping layer 110 can be formed over IC 100 using any suitable deposition technique (or combination of such techniques), as typically done. Furthermore, the dimensions of dielectric capping layer 110 can be customized as desired for a given target application or end-use. In some instances, dielectric capping layer 110 may have a substantially uniform thickness over the topography provided, for example, by any underlying layers of IC 100 (e.g., insulator layer 102; interconnects 108; barrier layers 106). In some instances, dielectric capping layer 110 may be provided as a substantially conformal layer over such topography. In some other instances, dielectric capping layer 110 may be provided with a non-uniform or otherwise varying thickness over such topography. For example, in some cases a first portion of dielectric capping layer 110 may have a thickness within a first range while a second portion thereof has a thickness within a second, different range. Other suitable materials, dimensions, and techniques for forming dielectric capping layer 110 will depend on a given application and will be apparent in light of this disclosure.

Figure 3:
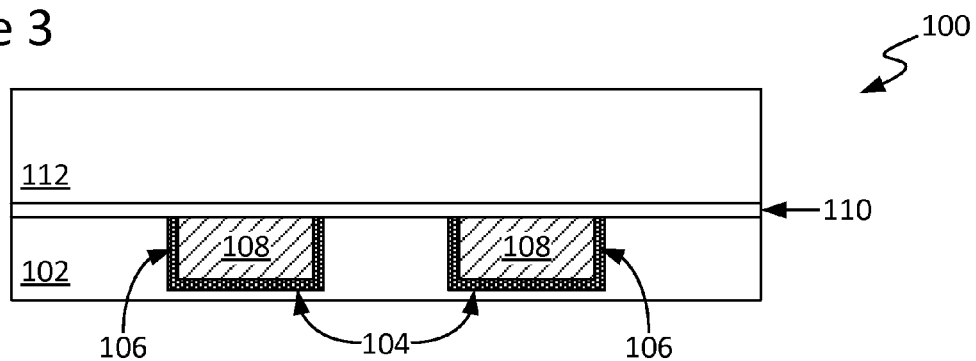
FIG. 3 is a cross-sectional view of the IC of FIG. 2 after formation of a porous inter-layer dielectric (ILD) layer, in accordance with an embodiment of the present disclosure.

The process may continue as in FIG. 3, which is a cross-sectional view of the IC 100 of FIG. 2 after formation of a porous inter-layer dielectric (ILD) layer 112, in accordance with an embodiment of the present disclosure. ILD layer 112 can be formed from any of a wide range of dielectric materials. Some example suitable materials for ILD layer 112 include: silicon dioxide ($SiO_2$); a carbon (C)-doped silicon oxide; a carbosiloxane; a carbosilane; a nitrogen (N)-doped variation of any thereof; and/or a combination of any one or more of the aforementioned. In some cases, ILD layer 112 may be formed from an ultra-low-κ (ULK) dielectric material. For example, in some embodiments, ILD layer 112 may be formed from a material having a dielectric constant (κ-value) in the range of about 1.6-2.3, which generally may correspond with a porosity value in the range of about 30-60%. In some other embodiments, ILD layer 112 may be formed from a material having a κ-value of less than or equal to about 1.6, which generally may correspond with a porosity value greater than or equal to about 60%. In some still other embodiments, ILD layer 112 may be formed from a material having a κ-value in the range of about 2.3-2.7, which generally may correspond with a porosity value in the range of about 15-30%. In some cases, ILD layer 112 may be formed from a porous dielectric material having an average pore size in the range of about 1-30 nm (e.g., about 1-10 nm, about 10-30 nm, or any other sub-range in the range of about 1-30 nm). Other suitable materials for ILD layer 112 will depend on a given application and will be apparent in light of this disclosure.

Also, ILD layer 112 can be formed over IC 100 using any of a wide variety of techniques. For example, in some cases, ILD layer 112 may be deposited using: a physical vapor deposition (PVD) process; a chemical vapor deposition (CVD) process, such as plasma-enhanced CVD (PECVD); and/or a spin-on deposition (SOD) process. In accordance with some embodiments, after deposition, ILD layer 112 may undergo one or more curing processes. For example, in accordance with some embodiments, ILD layer 112 may be cured by exposure to a flux of diffuse electrons (e.g., by a flood electron beam). In some other embodiments, curing of ILD layer 112 may be performed, for example, utilizing a flux of ultraviolet (UV) photons and/or infrared (IR) photons. In some still other embodiments, a thermal treatment can be utilized to cure ILD layer 112; for instance, ILD layer 112 can be exposed to a temperature in the range of about 200-450° C. (e.g., about 250-300° C., about 300-350° C., about 350-400° C., or any other sub-range in the range of about 200-450° C.). In some cases, a combination of any of these example curing techniques may be utilized to cure ILD layer 112. In accordance with some embodiments, curing of ILD layer 112 may help to shrink its dimensions and/or increase its strength for subsequent stuffing with one or more sacrificial pore-stuffing materials, as discussed herein. Other suitable techniques for forming ILD layer 112 will depend on a given application and will be apparent in light of this disclosure.

Furthermore, the dimensions of ILD layer 112 can be customized as desired for a given target application or end-use. For example, in some embodiments, ILD layer 112 may have a thickness in the range of about 20-200 nm (e.g., about 20-110 nm, about 110-200 nm, or any other sub-range in the range of about 20-200 nm). In some other embodiments, ILD layer 112 may have a thickness in the range of about 200-3,000 nm (e.g., about 200-1,600 nm, about 1,600-3,000 nm, or any other sub-range in the range of about 200-3,000 nm). In some instances, ILD layer 112 may have a substantially uniform thickness over the topography provided, for example, by the underlying dielectric capping layer 110. In some instances, ILD layer 112 may be provided as a substantially conformal layer over such topography. In some other instances, ILD layer 112 may be provided with a non-uniform or otherwise varying thickness over such topography. For example, in some cases a first portion of ILD layer 112 may have a thickness within a first range while a second portion thereof has a thickness within a second, different range. Other suitable dimensions for ILD layer 112 will depend on a given application and will be apparent in light of this disclosure.

Figure 4:
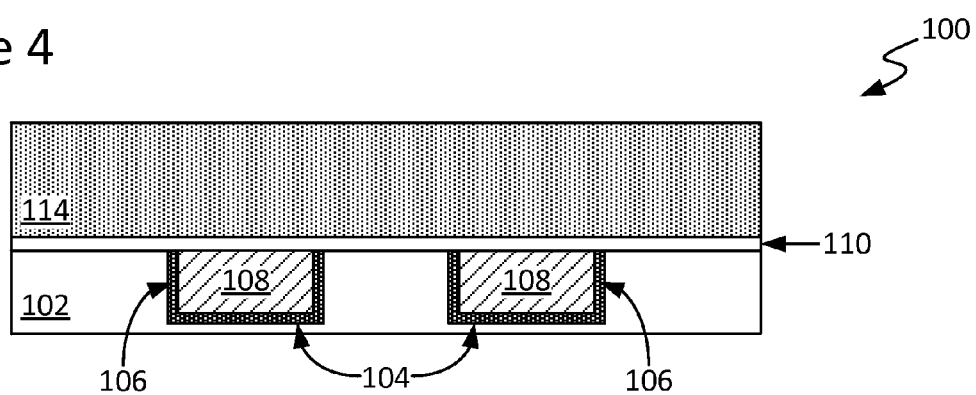
FIG. 4 is a cross-sectional view of the IC of FIG. 3 after deposition of a pore-stuffing material within the pores of the ILD layer, thereby providing a non-porous or otherwise low-porosity stuffed ILD layer, in accordance with an embodiment of the present disclosure.

The process may continue as in FIG. 4, which is a cross-sectional view of the IC 100 of FIG. 3 after deposition of a pore-stuffing material within the pores of ILD layer 112, thereby providing a non-porous or otherwise low-porosity stuffed ILD layer 114, in accordance with an embodiment of the present disclosure. The pores of ILD layer 112 can be stuffed with any of a wide range of pore-stuffing materials. Some example suitable pore-stuffing materials include: titanium nitride (TiN); titanium dioxide ($TiO_2$); silicon dioxide ($SiO_2$); silicon nitride ($Si_3N_4$); amorphous silicon (a-Si); tungsten (W); and/or a combination of any one or more thereof. In some cases, it may be desirable to ensure that the chosen pore-stuffing material(s) may be etched away selectively (e.g., as described below with reference to FIG. 13) as compared to other materials present in IC 100 (e.g., ILD layer 112; dielectric capping layer 110; insulator layer 102; interconnects 108; interconnects 126a/b). Also, it may be desirable, in some cases, to ensure that the selected pore-stuffing material(s) comprise molecules of sufficiently small molecular size to fit within the pores of ILD layer 112 (e.g., average pore size discussed above) and thus provide for the desired degree of pore stuffing to form stuffed ILD layer 114. Furthermore, it may be desirable in some cases to ensure that the selected pore-stuffing material(s) are sufficiently refractory so as to be compatible with integration processing, which can involve temperatures in the range of about 300-500° C. (e.g., about 375-475° C., or any other sub-range in the range of about 300-500° C.). However, the sacrificial pore-stuffing material is not so limited to this example processing temperature range, as in a more general sense, a sufficiently refractory material may include any one or more materials which are resistant to heat associated with subsequent processing, in accordance with some embodiments. Other suitable materials for use as the pore-stuffing material(s) will depend on a given application and will be apparent in light of this disclosure.

The pore-stuffing material(s) can be deposited within the pores of ILD layer 112 using any of a wide range of techniques which provide for a sufficient degree of high-aspect-ratio gap-filling. For instance, some example suitable techniques include: an atomic layer deposition (ALD) process; a chemical vapor deposition (CVD) process; and/or a spin-on deposition (SOD) process. In some other instances, a stop-flow, ultra-conformal deposition process can be used to fill the pores of ILD layer 112 with the pore-stuffing material(s). In accordance with some embodiments, during deposition of the pore-stuffing material(s), ILD layer 112 optionally may undergo any one or more of the example curing processes (e.g., diffuse electrons, UV photons, IR photons, and/or thermal) discussed above with reference to FIG. 3. In accordance with some embodiments, this optional curing of ILD layer 112 may help to maintain the structure of stuffed ILD layer 114 as it undergoes processing. Other suitable techniques for depositing the pore-stuffing material within the pores of ILD layer 112 to form stuffed ILD layer 114 will depend on a given application and will be apparent in light of this disclosure.

Figure 7:
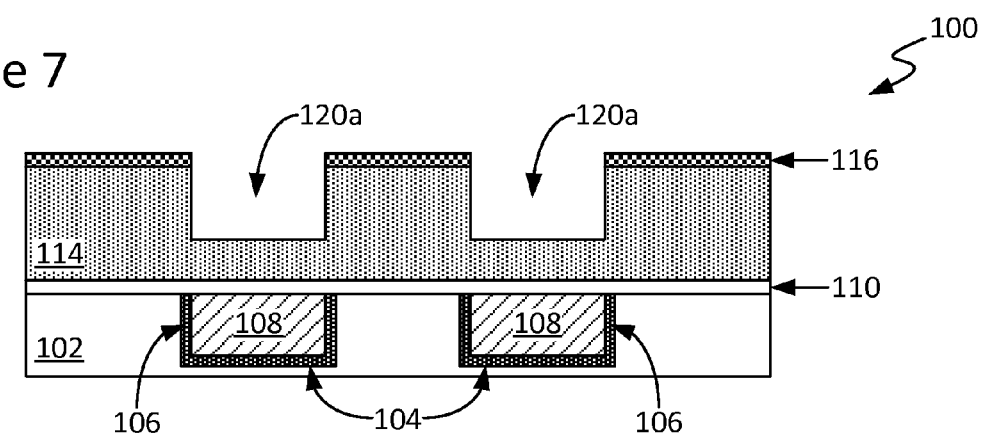
FIG. 7 is a cross-sectional view of the IC of FIG. 6 after forming one or more trench openings therein, in accordance with an embodiment of the present disclosure.

In accordance with some embodiments, the presence of the pore-stuffing material within the pores of ILD layer 112 may help to facilitate formation of clean trenches (e.g., trench openings 120a, discussed herein, for example, with reference to FIG. 7) by reducing the trench bottom roughness that is present after dry etching of the porous ILD layer 112, for instance, in a dual-damascene process. Also, in accordance with some embodiments, depositing the pore-stuffing material within the pores of ILD layer 112 may serve to seal the pores of ILD layer 112 and allow for that material to become electrically conductive. Consequently, in some instances, the electrically conductive stuffed ILD layer 114 may assist with formation of metal layer 126 (FIG. 11), as discussed herein. In some example cases in which a TiN-based pore-stuffing material is utilized, the conductivity and low sheet resistance of TiN may help to facilitate gap-fill electroplating by shunting the current to small features.

Figure 5:
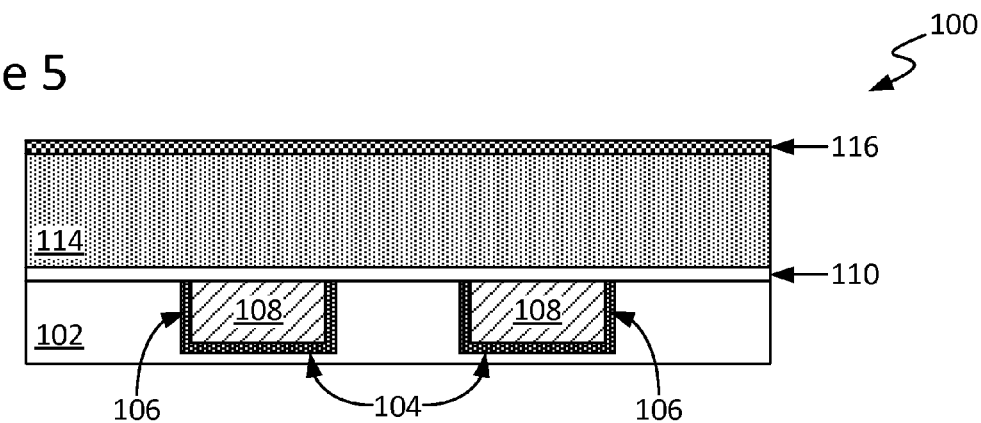
FIG. 5 is a cross-sectional view of the IC of FIG. 4 after formation of a hardmask layer, in accordance with an embodiment of the present disclosure.

The process may continue as in FIG. 5, which is a cross-sectional view of the IC 100 of FIG. 4 after formation of a hardmask layer 116, in accordance with an embodiment of the present disclosure. Hardmask layer 116 can be formed from any of a wide variety of hardmask materials. As will be appreciated in light of this disclosure, it may be desirable to ensure that the material(s) utilized in forming hardmask layer 116 are compatible, for example, with the pore-stuffing material(s) utilized in filling the pores of the underlying stuffed ILD 114. Thus, if titanium nitride (TiN) is utilized as the pore-stuffing material, then hardmask layer 116 may be formed, in accordance with some embodiments, from: an ashable highly carbon (C)-containing hardmask (e.g., having a carbon content greater than or equal to about 40% by weight); a silicon-containing anti-reflective coating (SiARC); aluminum oxide ($Al_2O_3$); and/or titanium nitride (TiN), among others. In accordance with some embodiments, hardmask layer 116 may help, at least in part, to protect against flair of the sidewalls of the one or more trench openings 120a (FIG. 7) during self-aligned via (SAV)/trench etching (e.g., discussed with reference to FIGS. 7-10) of stuffed ILD layer 114. Other suitable materials for hardmask layer 116 will depend on a given application and will be apparent in light of this disclosure.

Also, hardmask layer 116 may be formed using any of a wide range of suitable techniques. For example, in accordance with some embodiments, hardmask layer 116 may be formed using: a chemical vapor deposition (CVD) process, such as plasma-enhanced CVD (PECVD); a physical vapor deposition (PVD) process; a spin-on deposition (SOD) process; and/or an atomic layer deposition (ALD) process. Other suitable techniques for forming hardmask layer 116 will depend on a given application and will be apparent in light of this disclosure.

Furthermore, the dimensions of hardmask layer 116 can be customized. For example, in some embodiments, hardmask layer 116 may have a thickness in the range of about 100-400 Å (e.g., about 150-250 Å, about 250-350 Å, or any other sub-range in the range of about 100-400 Å). In some instances, hardmask layer 116 may have a substantially uniform thickness over the topography provided, for example, by the underlying stuffed ILD layer 114. In some instances, hardmask layer 116 may be provided as a substantially conformal layer over such topography. In some other instances, hardmask layer 116 may be provided with a non-uniform or otherwise varying thickness over such topography. For example, in some cases a first portion of hardmask layer 116 may have a thickness within a first range while a second portion thereof has a thickness within a second, different range. Other suitable thicknesses for hardmask layer 116 will depend on a given application and will be apparent in light of this disclosure.

Figure 6:
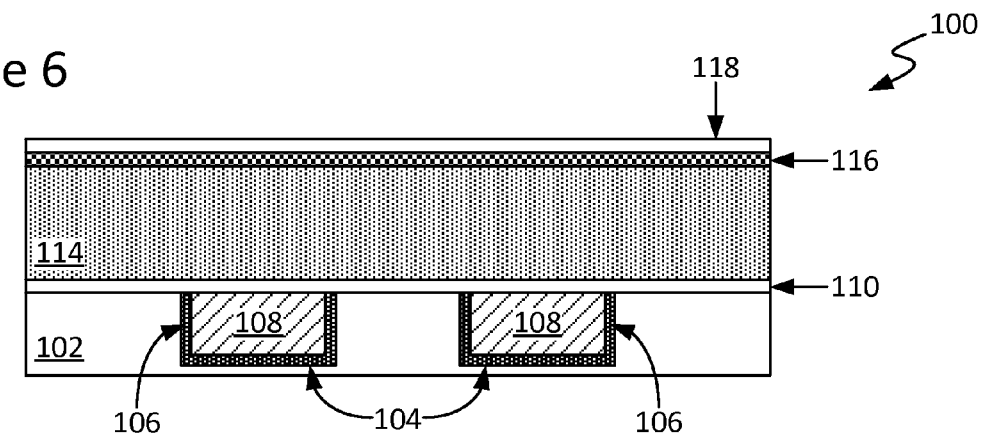
FIG. 6 is a cross-sectional view of the IC of FIG. 5 after formation of a lithography stack, in accordance with an embodiment of the present disclosure.

The process may continue as in FIG. 6, which is a cross-sectional view of the IC 100 of FIG. 5 after formation of a lithography stack 118, in accordance with an embodiment of the present disclosure. Lithography stack 118 may be formed using any suitable resist or other lithography material (or combination of such materials), as will be apparent in light of this disclosure. Also, lithography stack 118 may be formed using any suitable lithography technique (or combination of techniques), as typically done. Furthermore, the dimensions of lithography stack 118 can be customized as desired for a given target application or end-use. In addition, lithography stack 118 can be patterned with one or more openings therein, for example, which may be utilized in patterning the one or more trench openings 120a, as discussed herein. Other suitable materials, dimensions, and techniques for forming lithography stack 118 will depend on a given application and will be apparent in light of this disclosure.

The process may continue as in FIG. 7, which is a cross-sectional view of the IC 100 of FIG. 6 after forming one or more trench openings 120a therein, in accordance with an embodiment of the present disclosure. The one or more trench openings 120a can be formed in IC 100 using any suitable patterning process (or combination of such processes). For example, in some cases, the one or more trench openings 120a may be patterned using any suitable lithography techniques, including self-aligned via (SAV)/trench patterning and subsequent etch (e.g., wet etch and/or dry etch) processes followed by polishing, cleans, etc., as typically done. As will be appreciated in light of this disclosure, in forming the one or more trench openings 120a, it may be desirable to utilize an etch chemistry that is compatible, for example, with the pore-stuffing material utilized in stuffed ILD layer 114. For instance, if titanium nitride (TiN) is utilized as the pore-stuffing material, then the one or more trench openings 120a may be etched, in accordance with some embodiments, using a halogen-based etch chemistry, such as a fluorine (F)-based, chlorine (Cl)-based, and/or bromine (Br)-based etch chemistry. As can be seen further from FIG. 7, during formation of the one or more trench openings 120a, lithography stack 118 may be consumed (e.g., etched away), in some instances. Other suitable techniques for forming the one or more trench openings 120a will depend on a given application and will be apparent in light of this disclosure.

The geometry and spacing of the one or more trench openings 120a can be customized and, in some cases, may depend, at least in part, on the dimensions of one or more corresponding openings patterned in lithography stack 118 (e.g., as noted above with respect to FIG. 6). In some example cases, a given trench opening 120a may have a generally well-like or trench-like configuration having a substantially rectangular cross-sectional profile (e.g., as can be seen generally from FIG. 7). In some embodiments, neighboring trench openings 120a may be substantially equidistantly spaced from one another (e.g., may exhibit a substantially constant spacing). In some other embodiments, however, the spacing of the one or more trench openings 120a may be varied as desired. In some example cases, neighboring trench openings 120a may be separated from one another by a distance in the range of about 5-100 nm (e.g., about 20-50 nm, about 50-80 nm, or any other sub-range in the range of about 5-100 nm). Other suitable geometries and spacing for the one or more trench openings 120a of IC 100 will depend on a given application and will be apparent in light of this disclosure.

Also, the dimensions of a given trench opening 120a can be customized. For example, in some embodiments, a given trench opening 120a may have a depth in the range of about 100-1000 Å (e.g., about 200-500 Å, about 500-800 Å, or any other sub-range in the range of about 100-1000 Å). In some embodiments, a given trench opening 120a may have a width, for example, in the range of about 50-500 Å (e.g., about 100-250 Å, about 250-400 Å, or any other sub-range in the range of about 50-500 Å). In some instances, a given trench opening 120a may have a height-to-width aspect ratio in the range of about 1:1 to 10:1. As can be seen, a given trench opening 120a can be configured so as not to traverse the entire thickness of stuffed ILD layer 114, such that an upper surface of dielectric capping layer 110 (or any intermediate layer) is not exposed under the etched region(s), in accordance with some embodiments. Also, in some cases, the depth of a given trench opening 120a (e.g., the trench depth) may depend, at least in part, on the thickness of the pore-stuffing material (e.g., TiN) utilized in stuffed ILD layer 114. Furthermore, in some cases, the dimensions of a given trench opening 120a may depend, at least in part, on the dimensions of a corresponding opening patterned in lithography stack 118 (e.g., as noted above with respect to FIG. 6). Other suitable dimensions for the one or more trench openings 120a of IC 100 will depend on a given application and will be apparent in light of this disclosure.

Figure 8:
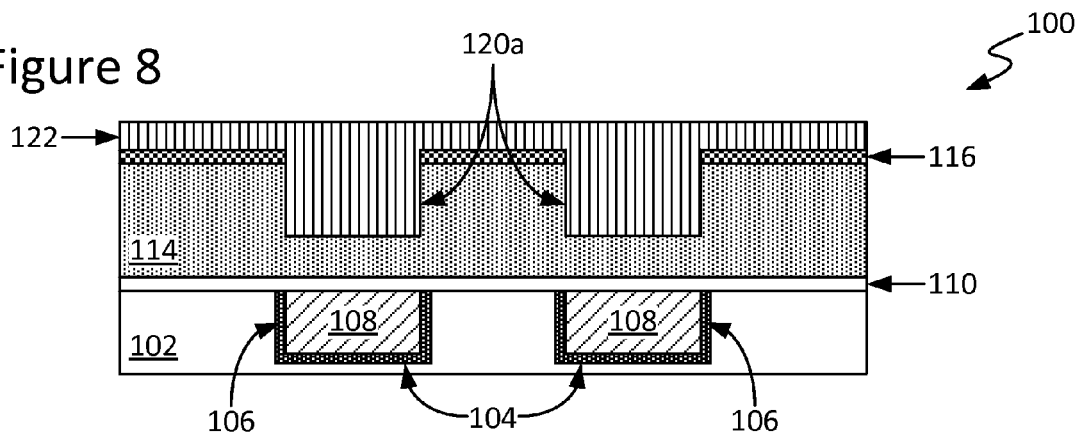
FIG. 8 is a cross-sectional view of the IC of FIG. 7 after forming a patterning layer, in accordance with an embodiment of the present disclosure.

The process may continue as in FIG. 8, which is a cross-sectional view of the IC 100 of FIG. 7 after forming patterning layer 122, in accordance with an embodiment of the present disclosure. Patterning layer 122 may serve, at least in part, to: (1) fill the one or more trench openings 120a of IC 100 and thus provide IC 100 with a substantially planar surface on which one or more lithography layers may be formed prior to forming the one or more via openings 120b; and/or (2) protect underlying areas from damage during formation of the one or more via openings 120b. To these ends, patterning layer 122 can be formed from any of a wide variety of materials. For example, in accordance with some embodiments, patterning layer 122 may be formed from: a sacrificial light-absorbing material (SLAM); a highly carbon (C)-containing hardmask (e.g., having a carbon content greater than or equal to about 40% by weight); and/or a silicon-containing anti-reflective coating (SiARC), among others. As will be appreciated in light of this disclosure, it may be desirable, in some instances, to ensure that the material(s) utilized in forming patterning layer 122 are compatible, for example, with the material(s) of any underlying layers of IC 100 (e.g., hardmask layer 116; the one or more pore-stuffing materials of stuffed ILD layer 114). Other suitable materials for patterning layer 122 will depend on a given application and will be apparent in light of this disclosure.

Also, patterning layer 122 can be formed over IC 100 using any of a wide variety of techniques. For example, in accordance with some embodiments, patterning layer 122 may be formed using: a chemical vapor deposition (CVD) process, such as plasma-enhanced CVD (PECVD); and/or a spin-on deposition (SOD) process. Other suitable techniques for forming patterning layer 122 will depend on a given application and will be apparent in light of this disclosure.

Furthermore, the dimensions of patterning layer 122 can be customized as desired for a given target application or end-use. As will be appreciated in light of this disclosure, patterning layer 122 may be provided with a non-uniform or otherwise varying thickness over the topography provided, for example, by any underlying layers of IC 100 (e.g., patterned hardmask layer 116; stuffed ILD layer 114 patterned with the one or more trench openings 120a). That is, layer 122 may be formed, at least in part, within the one or more trench openings 120a and/or over an upper surface of patterned hardmask layer 116, in accordance with some embodiments. Other suitable dimensions for patterning layer 122 will depend on a given application and will be apparent in light of this disclosure.

Figure 9:
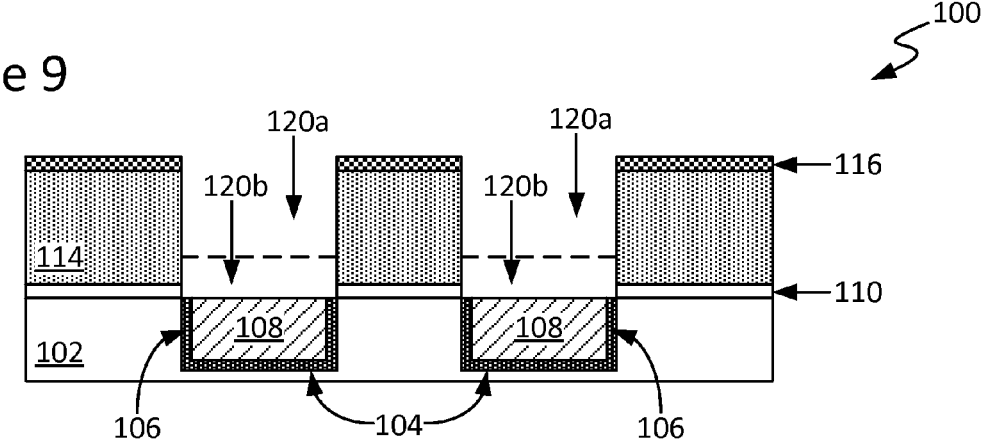
FIG. 9 is a cross-sectional view of the IC of FIG. 8 after forming one or more via openings therein, in accordance with an embodiment of the present disclosure.

The process may continue as in FIG. 9, which is a cross-sectional view of the IC 100 of FIG. 8 after forming one or more via openings 120b therein, in accordance with an embodiment of the present disclosure. As will be appreciated in light of this disclosure, the view of FIG. 9, for example, is taken along a cross-section of a via opening 120b formed in IC 100. Thus, to more clearly delineate the transition of a given trench opening 120a to an underlying via opening 120b associated therewith, a dashed line has been included in the figures to generally signify such transition. It should be noted, however, that the dashed lines included in the figures to depict the transition of a given trench opening 120a to an underlying via opening 120b (and consequently of a given interconnect from an upper trench portion 128a to a lower via portion 128b, as discussed herein) are intended to be generally representative of such a transition and are not intended to limit the dimensions, geometry, and/or other characteristics of the patterned openings or interconnects which may be formed in IC 100, as described herein.

The one or more via openings 120b can be formed in IC 100 using any suitable patterning process (or combination of such processes). For example, in some cases, the one or more via openings 120b may be patterned using any suitable lithography techniques, including self-aligned via (SAV)/trench patterning and subsequent etch (e.g., wet etch and/or dry etch) processes followed by polishing, cleans, etc., as typically done. As will be appreciated in light of this disclosure, in forming the one or more via openings 120b, it may be desirable to utilize an etch chemistry that is compatible, for example, with the pore-stuffing material utilized in stuffed ILD layer 114. For instance, if titanium nitride (TiN) is utilized as the pore-stuffing material, then the one or more via openings 120b may be etched, in accordance with some embodiments, using a halogen-based etch chemistry, such as a fluorine (F)-based, chlorine (Cl)-based, and/or bromine (Br)-based etch chemistry. As previously noted, patterning layer 122 may help to ensure that during formation of the one or more via openings 120b, the one or more previously formed trench openings 120a may be substantially unaffected (e.g., in dimensions and/or geometry, for instance, due to protection by the fill material of patterning layer 122), in accordance with some embodiments. As can be seen further from FIG. 9, after formation of the one or more via openings 120b, patterning layer 122 may be removed. Other suitable techniques for forming the one or more via openings 120b will depend on a given application and will be apparent in light of this disclosure.

The geometry and spacing of the one or more via openings 120b can be customized and, in some cases, may depend, at least in part, on the one or more lithography layers formed on patterning layer 122 (e.g., as noted above with respect to FIG. 8). In some example cases, a given via opening 120b may have a generally well-like or via-like configuration having a substantially rectangular cross-sectional profile (e.g., as can be seen generally from FIG. 9). In some embodiments, neighboring via openings 120b may be substantially equidistantly spaced from one another (e.g., may exhibit a substantially constant spacing). In some other embodiments, however, the spacing of the one or more via openings 120b may be varied as desired. In some example cases, neighboring via openings 120b may be separated from one another by a distance in the range of about 5-100 nm (e.g., about 20-50 nm, about 50-80 nm, or any other sub-range in the range of about 5-100 nm). Other suitable geometries and spacing for the one or more via openings 120b of IC 100 will depend on a given application and will be apparent in light of this disclosure.

Also, the dimensions of a given via opening 120b can be customized as desired for a given target application or end-use. For example, in some embodiments, a given via opening 120b may have a depth in the range of about 100-2,000 Å (e.g., about 200-500 Å, about 500-800 Å, about 800-1,100 Å, about 1,100-1,400 Å, about 1,400-1,700 Å, or any other sub-range in the range of about 100-2,000 Å). In some embodiments, a given via opening 120b may have a width, for example, in the range of about 50-500 Å (e.g., about 100-250 Å, about 250-400 Å, or any other sub-range in the range of about 50-500 Å). In some instances, a given via opening 120b may have a height-to-width aspect ratio in the range of about 1:1 to 10:1. As can be seen, a given via opening 120b can be configured so as to traverse the remaining thickness of stuffed ILD layer 114 (e.g., that portion of layer 114 remaining after formation of a given trench opening 120a associated with such via opening 120b). Consequently, a given underlying interconnect 108 and barrier layer 106 (if included) may be exposed, at least in part, under the etched region(s) of stuffed ILD layer 114, in accordance with some embodiments. Furthermore, in some cases, the dimensions of a given via opening 120b may depend, at least in part, on the dimensions of one or more lithography layers provided over patterning layer 122 (e.g., as noted above with respect to FIG. 8). Other suitable dimensions for the one or more via openings 120b of IC 100 will depend on a given application and will be apparent in light of this disclosure.

Figure 10:
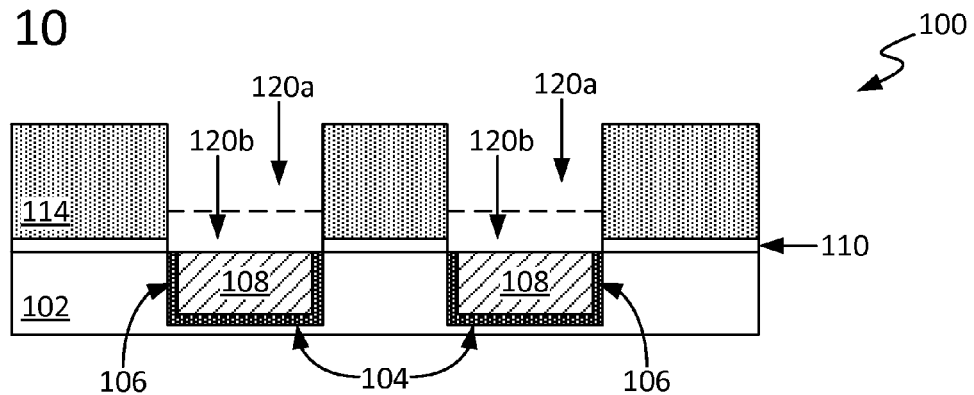
FIG. 10 is a cross-sectional view of the IC of FIG. 9 after removal of the hardmask layer, in accordance with an embodiment of the present disclosure.

The process may continue as in FIG. 10, which is a cross-sectional view of the IC 100 of FIG. 9 after optional removal of hardmask layer 116, in accordance with an embodiment of the present disclosure. Hardmask layer 116 can be removed from IC 100 using any suitable clean process or other technique. As will be appreciated in light of this disclosure, it may be desirable to ensure that the process selected for removal of hardmask layer 116 is compatible, for example, with the particular pore-stuffing material utilized in the underlying stuffed ILD layer 114, in accordance with some embodiments. In accordance with some other embodiments, hardmask layer 116 may remain intact over stuffed ILD layer 114, for example, until planarization of IC 100, as discussed with reference to FIG. 12. Other suitable techniques for removing hardmask layer 114 will depend on a given application and will be apparent in light of this disclosure.

Figure 11:
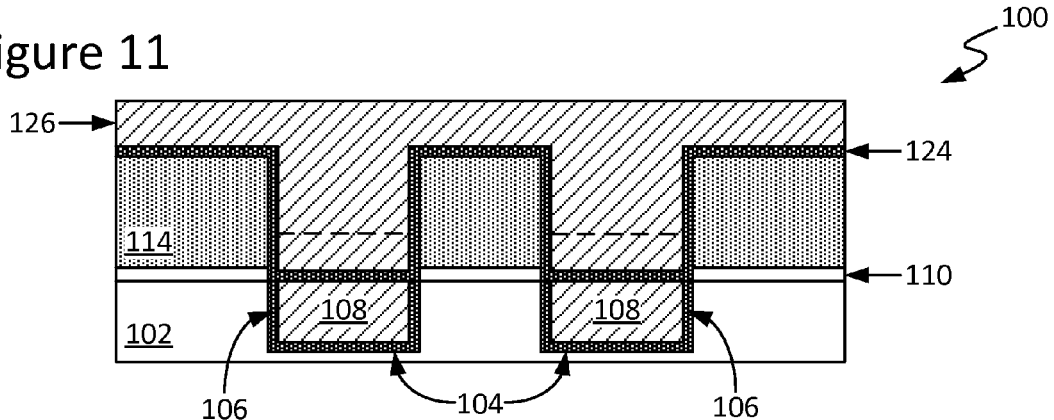
FIG. 11 is a cross-sectional view of the IC of FIG. 10 after formation of a barrier layer and metal layer, in accordance with an embodiment of the present disclosure.

The process may continue as in FIG. 11, which is a cross-sectional view of the IC 100 of FIG. 10 after formation of a barrier layer 124 and a metal layer 126, in accordance with an embodiment of the present disclosure. As can be seen from FIG. 11, barrier layer 124 may be formed over IC 100, for example, at least in part within the one or more trench openings 120a and/or the one or more via openings 120b of IC 100, in accordance with some embodiments. Also, in accordance with some embodiments, barrier layer 124 may be configured, for example: (1) to limit (e.g., prevent or otherwise reduce) diffusion of the metal(s) of a given interconnect 126a/b into ILD layer 112; and/or (2) to serve as a seed layer for the metal(s) of a given interconnect 126a/b.

To these ends, barrier layer 124 can be formed from any of a wide range of suitable materials. For instance, in accordance with some embodiments, barrier layer 124 may be formed from any one or more of the example materials discussed above with reference to barrier layer 106. As will be appreciated in light of this disclosure, it may be desirable to ensure that barrier layer 124 is formed from material(s) which provide sufficiently high electrical conductivity to maintain suitable electronic contact, for example, with the sacrificial pore-stuffing material (e.g., TiN, $TiO_2$) contained within the stuffed ILD layer 114. Also, barrier layer 124 can be formed using any suitable technique (or combination of techniques), such as any one or more of the example techniques discussed above with reference to barrier layer 106. Other suitable materials and techniques for forming barrier layer 124 will depend on a given application and will be apparent in light of this disclosure.

Furthermore, the dimensions of barrier layer 124 can be customized as desired for a given target application or end-use. For example, in some embodiments, barrier layer 124 may have a thickness in the range of about 0.1-40 Å (e.g., about 1-15 Å, about 15-30 Å, or any other sub-range in the range of about 0.1-40 Å). In some instances, barrier layer 124 may have a substantially uniform thickness over the topography provided, for example, by the underlying stuffed ILD layer 114 patterned with one or more trench openings 120*a* and/or one or more via openings 120*b*. Also, in some instances, barrier layer 124 also may be formed, at least in part, over one or more underlying interconnects 108 and barrier layers 106 (if included) of IC 100. In some cases, barrier layer 124 may be provided as a substantially conformal layer over such topography. In some other instances, barrier layer 124 may be provided with a non-uniform or otherwise varying thickness over such topography. For example, in some cases a first portion of barrier layer 124 may have a thickness within a first range while a second portion thereof has a thickness within a second, different range. In accordance with some embodiments, barrier layer 124 can be provided, for example, as a single layer film or a multi-layer film (e.g., a bi-layer, a tri-layer, etc.), as desired. Other suitable dimensions for barrier layer 124 will depend on a given application and will be apparent in light of this disclosure.

As can be seen further from FIG. 11, metal layer 126 may be formed over IC 100. In some cases, metal layer 126 may be formed directly on barrier layer 124, while in some other cases one or more intermediate layers may be provided between metal layer 126 and underlying barrier layer 124. In any such case, metal layer 126 may be formed, at least in part, within the one or more trench openings 120*a* and the one or more via openings 120*b* of IC 100, in accordance with some embodiments. Metal layer 126 can be formed from any of a wide variety of electrically conductive metals. For instance, in accordance with some embodiments, metal layer 126 may be formed from any one or more of the example materials discussed above with reference to the one or more interconnects 108. Other suitable materials for metal layer 126 will depend on a given application and will be apparent in light of this disclosure.

Also, metal layer 126 can be formed using any suitable technique (or combination of techniques). For example, in some embodiments, metal layer 126 may be formed using: an electroplating process; an electroless deposition process; and/or a wet seed process. As previously noted, and in accordance with some embodiments, stuffing the pores of ILD layer 112 with the pore-stuffing material may serve to seal the pores of ILD layer 112 and allow for that material to become electrically conductive. Consequently, in some instances, the electrically conductive stuffed ILD layer 114 may assist with formation of metal layer 126 using any of the aforementioned techniques. In some example cases in which a TiN-based pore-stuffing material is utilized, the conductivity and low sheet resistance of TiN may help to facilitate gap-fill electroplating by shunting the current to small features. Other suitable techniques for forming metal layer 126 will depend on a given application and will be apparent in light of this disclosure.

Furthermore, the dimensions of metal layer 126 can be customized as desired for a given target application or end-use. For example, in some embodiments, metal layer 126 may have a thickness in the range of about 0.1-1.0 μm (e.g., about 0.2-0.5 μm, about 0.5-0.8 μm, or any other sub-range in the range of about 0.1-1.0 μm). In some instances, metal layer 126 may be provided with a non-uniform or otherwise varying thickness over the topography provided, for example, by any underlying layers of IC 100 (e.g., barrier layer 124; stuffed ILD layer 114 patterned with the one or more trench openings 120*a* and/or one or more via openings 120*b*). That is, in accordance with some embodiments, metal layer 126 may be formed over barrier layer 124, for example, within: (1) the one or more trench openings 120*a*; and/or (2) the one or more via openings 120*b*. Other suitable dimensions for metal layer 126 will depend on a given application and will be apparent in light of this disclosure.

Figure 12:
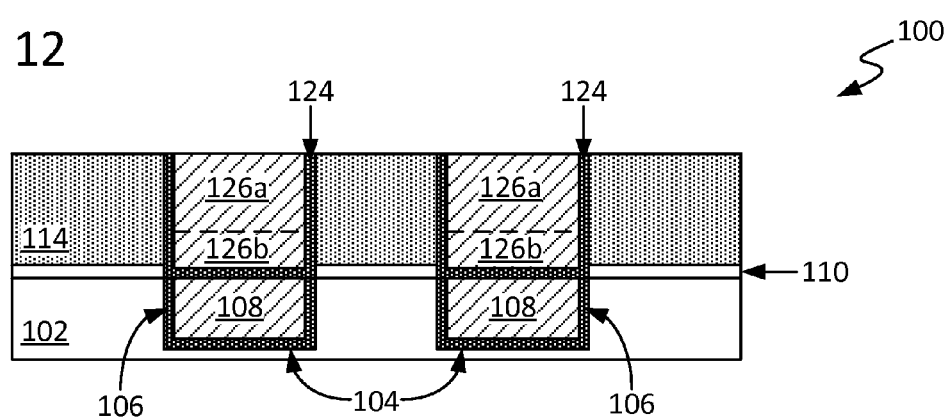
FIG. 12 is a cross-sectional view of the IC of FIG. 11 after planarization, in accordance with an embodiment of the present disclosure.

The process may continue as in FIG. 12, which is a cross-sectional view of the IC 100 of FIG. 11 after planarization, in accordance with an embodiment of the present disclosure. As will be appreciated in light of this disclosure, it may be desirable in some instances to planarize IC 100 after formation of metal layer 126 and barrier layer 124. To that end, IC 100 may undergo, for example: a chemical-mechanical planarization (CMP) process; an etch-and-clean process; and/or any other suitable planarization/polish process, as will be apparent in light of this disclosure. In accordance with some embodiments, planarization of IC 100 may be performed, for example, to remove any undesired excess of: (1) metal layer 126 (e.g., such as an overburden that may be present from overfilling a given opening 120*a/b* of stuffed ILD layer 114 with the interconnect fill metal or metals); (2) barrier layer 124 (e.g., such as may extend over an upper surface topography provided by stuffed ILD layer 114); and/or (3) any remainder of hardmask layer 116. Other suitable techniques for planarizing IC 100 will depend on a given application and will be apparent in light of this disclosure.

As can be seen from FIG. 12, after planarization, IC 100 may include: (1) one or more trench-type electrical interconnects 126*a* formed therein; and/or (2) one or more via-type electrical interconnects 126*b* formed therein. The geometry and/or dimensions of a given interconnect 126*a/b* of IC 100 can be customized as desired for a given target application or end-use. As will be appreciated in light of this disclosure, the dimensions and geometry of a given trench-type interconnect 126*a* may depend, at least in part, on the configuration of the trench opening 120*a* and/or barrier layer 124 associated therewith. Thus, if a given trench opening 120*a* of stuffed ILD layer 114 is provided with a generally well-like or trench-like configuration having a substantially rectangular cross-sectional profile, then a corresponding trench-type interconnect 126*a* may have a substantially similar profile, in accordance with some embodiments. As will be further appreciated, the dimensions and geometry of a given via-type interconnect 126*b* may depend, at least in part, on the configuration of the via opening 120*b* and/or barrier layer 124 associated therewith. Thus, if a given via opening 120*b* of stuffed ILD layer 114 is provided with a generally well-like or via-like configuration having a substantially rectangular cross-sectional profile, then a corresponding via-type interconnect 126*b* may have a substantially similar profile, in accordance with some embodiments. In a more general sense, a given interconnect 126*a/b* may have any of a wide range of configurations, including, for example: a single-damascene interconnect structure (e.g., a trench; a via); a dual-damascene interconnect structure (e.g., a trench with an underlying via); an anisotropic interconnect structure; and/or an isotropic interconnect structure, in accordance with some embodiments. Other suitable geometries and dimensions for the one or more interconnects 126*a/b* of IC 100 will depend on a given application and will be apparent in light of this disclosure.

Figure 13:
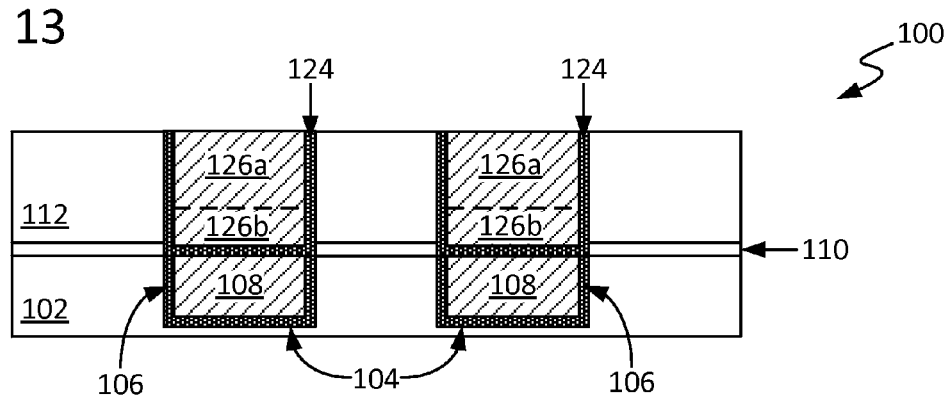
FIG. 13 is a cross-sectional view of the IC of FIG. 12 after removal of the pore-stuffing material from the stuffed ILD layer, in accordance with an embodiment of the present disclosure.

The process may continue as in FIG. 13, which is a cross-sectional view of the IC 100 of FIG. 12 after removal of the pore-stuffing material from stuffed ILD layer 114, in accordance with an embodiment of the present disclosure. The pore-stuffing material may be removed, at least in part, from stuffed ILD layer 114 using any of a wide variety of techniques. For example, in accordance with some embodiments, the pore-stuffing material can be removed, at least partially, from stuffed ILD layer 114 with a dry and/or wet etching process. The etch chemistry can be customized as desired and, in accordance with some embodiments, may be selective to etching the material(s) used to stuff the pores of ILD layer 112 as compared to other materials present in IC 100 (e.g., ILD layer 112; insulator layer 102; interconnects 108; interconnects 128a/b). In some cases in which the pore-stuffing material is TiN-based or $TiO_2$-based, for example, it may be desirable to utilize a wet etch chemistry for removal. Other suitable techniques for removing the pore-stuffing material from stuffed ILD later 114 to return to ILD layer 112 will depend on a given application and will be apparent in light of this disclosure.

In accordance with some embodiments, a significant amount of the pore-stuffing material can be removed from stuffed ILD layer 114 with minimal or otherwise negligible effect on any neighboring layers (e.g., barrier layer 124; one or more interconnects 126a/b; ILD layer 112). However, as previously noted, even after substantially removing the pore-stuffing material from stuffed ILD layer 114, trace amounts of one or more constituent components of that material may remain behind within the resultant ILD layer 112. For instance, in some cases in which a TiN-based pore-stuffing material is employed, trace amounts of residual Ti may remain within the porous ILD layer 112 after undergoing the selected removal process(es). However, in some such cases, despite a measurable presence of residual Ti from the TiN-based stuffing material, the host ILD layer 112 may exhibit no or an otherwise negligible effect on its κ-value, leakage, and/or time-dependent dielectric breakdown (TDDB) (e.g., as compared to a pristine ILD which has not undergone pore stuffing as described herein), in accordance with some embodiments.

In accordance with some embodiments, after removal of the pore-stuffing material, ILD layer 112 may undergo one or more curing processes. For example, in accordance with some embodiments, ILD layer 112 may be cured by exposure to a flux of diffuse electrons (e.g., by a flood electron beam). In some other embodiments, curing of ILD layer 112 may be performed, for example, utilizing a flux of ultraviolet (UV) photons and/or infrared (IR) photons. In some still other embodiments, a thermal treatment can be utilized to cure ILD layer 112; for instance, ILD layer 112 can be exposed to a temperature in the range of about 200-450° C. (e.g., about 250-300° C., about 300-350° C., about 350-400° C., or any other sub-range in the range of about 200-450° C.). In some cases, a combination of any of these example curing techniques may be utilized to cure ILD layer 112. In accordance with some embodiments, curing of ILD layer 112 may help to remove moisture therefrom and/or make that material hydrophobic. In some instances, curing of ILD layer 112 may help to increase its resilience for subsequent processing. In some cases, curing of ILD layer 112 may help to restore it to a given set of dielectric properties or otherwise improve its dielectric performance, as desired for a given target application or end-use. In some cases, ILD layer 112 may exhibit no or an otherwise negligible effect on its κ-value, leakage, and/or time-dependent dielectric breakdown (TDDB) (e.g., as compared to a pristine ILD which has not undergone pore stuffing as described herein), in accordance with some embodiments.

Example System

Figure 14:
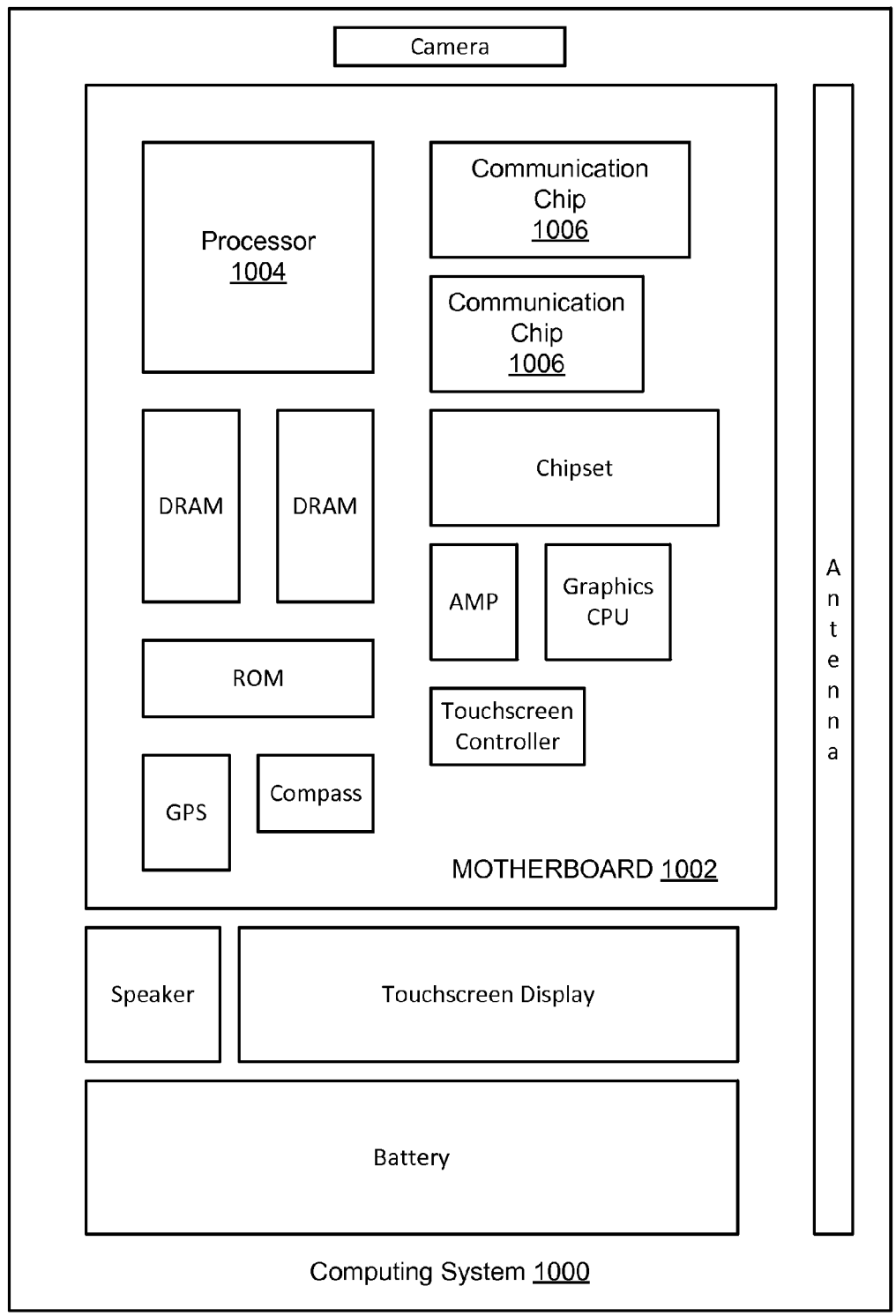
FIG. 14 illustrates a computing system implemented with integrated circuit structures or devices formed using the disclosed techniques, in accordance with an example embodiment.

FIG. 14 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a porous insulator layer having a refractory material deposited within its pores; and a first interconnect formed within the porous insulator layer.

Example 2 includes the subject matter of any of Examples 1 and 3-18, wherein the porous insulator layer comprises at least one of silicon dioxide ($SiO_2$), a carbon (C)-doped silicon oxide, a carbosiloxane, a carbosilane, a nitrogen (N)-doped variation of any thereof, and/or a combination of any one or more of the aforementioned.

Example 3 includes the subject matter of any of Examples 1-2 and 6-18, wherein the porous insulator layer has a dielectric constant ($\kappa$-value) in the range of about 1.6-2.3.

Example 4 includes the subject matter of any of Examples 1-2 and 6-18, wherein the porous insulator layer has a dielectric constant ($\kappa$-value) of less than or equal to about 1.6.

Example 5 includes the subject matter of any of Examples 1-2 and 6-18, wherein the porous insulator layer has a dielectric constant ($\kappa$-value) in the range of about 2.3-2.7.

Example 6 includes the subject matter of any of Examples 1-5 and 7-18, wherein the pores of the porous insulator layer have an average pore size in the range of about 1-30 nm.

Example 7 includes the subject matter of any of Examples 1-6 and 9-18, wherein the refractory material comprises at least one of titanium nitride (TiN), titanium dioxide ($TiO_2$), silicon dioxide ($SiO_2$), silicon nitride ($Si_3N_4$), amorphous silicon (a-Si), tungsten (W), a metal oxide, a metal nitride, and/or a combination of any one or more thereof.

Example 8 includes the subject matter of any of Examples 1-6 and 9-18, wherein the refractory material comprises titanium (Ti).

Example 9 includes the subject matter of any of Examples 1-8 and 10-18, wherein the refractory material is compatible with processing temperatures in the range of about 300-500° C.

Example 10 includes the subject matter of any of Examples 1-9 and 11-18, wherein the refractory material is compatible with deposition by at least one of an atomic layer deposition (ALD) process, a chemical vapor deposition (CVD) process, and/or a spin-on deposition (SOD) process.

Example 11 includes the subject matter of any of Examples 1-10 and 12-18, wherein the refractory material is compatible with deposition by a stop-flow, ultra-conformal deposition process.

Example 12 includes the subject matter of any of Examples 1-11 and 14-18, wherein the first interconnect is configured as a single-damascene interconnect.

Example 13 includes the subject matter of any of Examples 1-11 and 14-18, wherein the first interconnect is configured as a dual-damascene interconnect.

Example 14 includes the subject matter of any of Examples 1-13 and 15-18, wherein the first interconnect comprises at least one of copper (Cu), cobalt (Co), molybdenum (Mo), rhodium (Rh), beryllium (Be), chromium (Cr), manganese (Mn), aluminum (Al), ruthenium (Ru), palladium (Pd), tungsten (W), nickel (Ni), cobalt tungsten phosphide (CoWP), cobalt tungsten boron (CoWB), copper germanium (CuGe), silicon (Si), and/or a combination of any one or more thereof.

Example 15 includes the subject matter of any of Examples 1-14 and 16-18 and further includes a first barrier layer formed between the first interconnect and the porous insulator layer.

Example 16 includes the subject matter of Example 15, wherein the first barrier layer comprises at least one of tantalum (Ta), tantalum nitride (TaN), titanium (Ti), titanium nitride (TiN), manganese (Mn), manganese nitride (MnN), molybdenum (Mo), molybdenum nitride (MoN), cobalt tungsten phosphide (CoWP), cobalt tungsten boron (CoWB), and/or a combination of any one or more thereof.

Example 17 includes the subject matter of any of Examples 1-16 and 18-19, wherein the refractory material deposited within the pores of the porous dielectric layer provides that layer with electrical conductivity.

Example 18 includes the subject matter of any of Examples 1-17 and 19 and further including a lower metallized layer and/or a logic device formed under the porous insulator layer.

Example 19 includes the subject matter of Example 18 and further including a second interconnect formed within the lower metallized layer, wherein the second interconnect is in electronic contact with the first interconnect.

Example 20 is a method of forming an integrated circuit, the method including: forming a porous insulator layer over a lower circuit layer; depositing a refractory material within pores of the porous insulator layer; forming an interconnect structure within the porous insulator layer; and removing at least some of the refractory material from the pores of the porous insulator layer.

Example 21 includes the subject matter of any of Examples 20 and 22-41, wherein the porous insulator layer comprises at least one of silicon dioxide ($SiO_2$), a carbon (C)-doped silicon oxide, a carbosiloxane, a carbosilane, a nitrogen (N)-doped variation of any thereof, and/or a combination of any one or more of the aforementioned.

Example 22 includes the subject matter of any of Examples 20-21 and 25-41, wherein the porous insulator layer has a dielectric constant ($\kappa$-value) in the range of about 1.6-2.3.

Example 23 includes the subject matter of any of Examples 20-21 and 25-41, wherein the porous insulator layer has a dielectric constant ($\kappa$-value) of less than or equal to about 1.6.

Example 24 includes the subject matter of any of Examples 20-21 and 25-41, wherein the porous insulator layer has a dielectric constant ($\kappa$-value) in the range of about 2.3-2.7.

Example 25 includes the subject matter of any of Examples 20-24 and 26-41, wherein the pores of the porous insulator layer have an average pore size in the range of about 1-30 nm.

Example 26 includes the subject matter of any of Examples 20-25 and 27-41, wherein the refractory material comprises at least one of titanium nitride (TiN), titanium dioxide (TiO$_2$), silicon dioxide (SiO$_2$), silicon nitride (Si$_3$N$_4$), amorphous silicon (a-Si), tungsten (W), a metal oxide, a metal nitride, and/or a combination of any one or more thereof.

Example 27 includes the subject matter of any of Examples 20-26 and 28-41, wherein depositing the refractory material within the pores of the porous insulator layer comprises using at least one of an atomic layer deposition (ALD) process, a chemical vapor deposition (CVD) process, and/or a spin-on deposition (SOD) process.

Example 28 includes the subject matter of any of Examples 20-27 and 29-41, wherein depositing the refractory material within the pores of the porous insulator layer comprises using a stop-flow, ultra-conformal deposition process.

Example 29 includes the subject matter of any of Examples 20-28 and 30-41, wherein forming the interconnect structure within the porous insulator layer comprises: forming an opening in the porous insulator layer; forming a barrier layer within the opening; and depositing an electrically conductive material over the barrier layer.

Example 30 includes the subject matter of Example 29, wherein the opening comprises at least one of a trench opening and/or a via opening.

Example 31 includes the subject matter of Example 29, wherein the barrier layer comprises at least one of tantalum (Ta), tantalum nitride (TaN), titanium (Ti), titanium nitride (TiN), manganese (Mn), manganese nitride (MnN), molybdenum (Mo), molybdenum nitride (MoN), cobalt tungsten phosphide (CoWP), cobalt tungsten boron (CoWB), and/or a combination of any one or more thereof.

Example 32 includes the subject matter of Example 29, wherein the electrically conductive material comprises at least one of copper (Cu), cobalt (Co), molybdenum (Mo), rhodium (Rh), beryllium (Be), chromium (Cr), manganese (Mn), aluminum (Al), ruthenium (Ru), palladium (Pd), tungsten (W), nickel (Ni), cobalt tungsten phosphide (CoWP), cobalt tungsten boron (CoWB), copper germanium (CuGe), silicon (Si), and/or a combination of any one or more thereof.

Example 33 includes the subject matter of any of Examples 20-32 and 34-41, wherein forming the interconnect structure within the porous insulator layer comprises: forming a hardmask layer over the porous insulator layer having the refractory material deposited within its pores.

Example 34 includes the subject matter of Example 32, wherein the hardmask layer comprises at least one of an ashable carbon (C)-containing hardmask having a carbon content greater than or equal to about 40% by weight, a silicon-containing anti-reflective coating (SiARC), aluminum oxide (Al$_2$O$_3$), and/or titanium nitride (TiN).

Example 35 includes the subject matter of any of Examples 20-34 and 36-41, wherein forming the interconnect structure within the porous insulator layer comprises: forming a patterning layer over the porous insulator layer having the refractory material deposited within its pores.

Example 36 includes the subject matter of Example 35, wherein the patterning layer comprises at least one of a sacrificial light-absorbing material (SLAM), a carbon (C)-containing hardmask having a carbon content greater than or equal to about 40% by weight, and/or a silicon-containing anti-reflective coating (SiARC).

Example 37 includes the subject matter of any of Examples 20-36 and 38-41, wherein removing at least some of the refractory material from the pores of the porous insulator layer comprises using a wet etch process.

Example 38 includes the subject matter of any of Examples 20-37 and 39-41 and further includes curing the porous insulator layer.

Example 39 includes the subject matter of Example 38, wherein curing the porous insulator layer utilizes exposure to at least one of a diffuse electron beam, ultraviolet (UV) photons, infrared (IR) photons, and/or a temperature in the range of about 200-450° C.

Example 40 includes the subject matter of any of Examples 20-39 and 41, wherein the lower circuit layer includes at least one of metallization and/or a logic device.

Example 41 is an integrated circuit formed using the method including the subject matter of any of Examples 20-40.

Example 42 is an integrated circuit including: a porous dielectric layer having titanium (Ti), titanium nitride (TiN), or titanium dioxide (TiO$_2$) deposited within its pores; and an interconnect formed within the porous dielectric layer.

Example 43 includes the subject matter of any of Examples 42 and 44-50, wherein the porous dielectric layer comprises at least one of silicon dioxide (SiO$_2$), a carbon (C)-doped silicon oxide, a carbosiloxane, a carbosilane, a nitrogen (N)-doped variation of any thereof, and/or a combination of any one or more of the aforementioned.

Example 44 includes the subject matter of any of Examples 42-43 and 45-50, wherein the porous dielectric layer has a dielectric constant (κ-value) that is less than or equal to about 2.7.

Example 45 includes the subject matter of any of Examples 42-44 and 46-50, wherein the porous dielectric layer has a thickness in the range of about 20-200 nm.

Example 46 includes the subject matter of any of Examples 42-45 and 47-50, wherein the interconnect comprises at least one of copper (Cu), cobalt (Co), molybdenum (Mo), rhodium (Rh), beryllium (Be), chromium (Cr), manganese (Mn), aluminum (Al), ruthenium (Ru), palladium (Pd), tungsten (W), nickel (Ni), cobalt tungsten phosphide (CoWP), cobalt tungsten boron (CoWB), copper germanium (CuGe), silicon (Si), and/or a combination of any one or more thereof.

Example 47 includes the subject matter of any of Examples 42-46 and 49-50, wherein the interconnect is configured as a single-damascene structure.

Example 48 includes the subject matter of any of Examples 42-46 and 49-50, wherein the interconnect is configured as a dual-damascene structure.

Example 49 includes the subject matter of any of Examples 42-48 and 50 and further includes a barrier layer formed between the interconnect and the porous dielectric layer.

Example 50 includes the subject matter of Example 49, wherein the barrier layer comprises at least one of tantalum (Ta), tantalum nitride (TaN), titanium (Ti), titanium nitride (TiN), manganese (Mn), manganese nitride (MnN), molybdenum (Mo), molybdenum nitride (MoN), cobalt tungsten phosphide (CoWP), cobalt tungsten boron (CoWB), and/or a combination of any one or more thereof.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a porous insulator layer having a plurality of pores, wherein substantially all of the pores within the porous insulator layer contain at least a trace amount of refractory material, such that the trace amount is detectable but negligible with respect to dielectric constant of the porous insulator layer; and
   a first interconnect formed within the porous insulator layer.

2. The integrated circuit of claim 1, wherein the porous insulator layer comprises at least one of silicon dioxide ($SiO_2$), a carbon (C)-doped silicon oxide, a carbosiloxane, a carbosilane, a nitrogen (N)-doped variation of any thereof, and a combination of any one or more of the aforementioned.

3. The integrated circuit of claim 1, wherein the porous insulator layer has a dielectric constant (κ-value) in the range of about 1.6-2.3.

4. The integrated circuit of claim 1, wherein the porous insulator layer has a dielectric constant (κ-value) of less than or equal to about 1.6.

5. The integrated circuit of claim 1, wherein the porous insulator layer has a dielectric constant (κ-value) in the range of about 2.3-2.7.

6. The integrated circuit of claim 1, wherein the pores of the porous insulator layer have an average pore size in the range of about 1-30 nm.

7. The integrated circuit of claim 1, wherein the refractory material comprises at least one of titanium nitride (TiN), titanium dioxide ($TiO_2$), silicon dioxide ($SiO_2$), silicon nitride ($Si_3N_4$), amorphous silicon (a-Si), tungsten (W), a metal oxide, a metal nitride, and a combination of any one or more thereof.

8. The integrated circuit of claim 1, wherein the refractory material comprises titanium (Ti).

9. The integrated circuit of claim 1, wherein the refractory material is compatible with processing temperatures in the range of about 300-500° C.

10. The integrated circuit of claim 1, wherein the refractory material deposited within the pores of the porous dielectric layer provides that layer with electrical conductivity.

11. The integrated circuit of claim 1 further comprising at least one of a lower metallized layer and a logic device formed under the porous insulator layer.

12. A method of forming an integrated circuit, the method comprising:
   forming a porous insulator layer over a lower circuit layer;
   depositing a refractory material within pores of the porous insulator layer;
   forming an interconnect structure within the porous insulator layer; and
   removing at least some of the refractory material from the pores of the porous insulator layer.

13. The method of claim 12, wherein the porous insulator layer comprises at least one of silicon dioxide ($SiO_2$), a carbon (C)-doped silicon oxide, a carbosiloxane, a carbosilane, a nitrogen (N)-doped variation of any thereof, and a combination of any one or more of the aforementioned.

14. The method of claim 12, wherein the refractory material comprises at least one of titanium nitride (TiN), titanium dioxide ($TiO_2$), silicon dioxide ($SiO_2$), silicon nitride ($Si_3N_4$), amorphous silicon (a-Si), tungsten (W), a metal oxide, a metal nitride, and a combination of any one or more thereof.

15. The method of claim 12, wherein depositing the refractory material within the pores of the porous insulator layer comprises using at least one of an atomic layer deposition (ALD) process, a chemical vapor deposition (CVD) process, and a spin-on deposition (SOD) process.

16. The method of claim 12, wherein depositing the refractory material within the pores of the porous insulator layer comprises using a stop-flow, ultra-conformal deposition process.

17. The method of claim 12, wherein removing at least some of the refractory material from the pores of the porous insulator layer comprises using a wet etch process.

18. The method of claim 12 further comprising:
   curing the porous insulator layer.

19. The method of claim 18, wherein curing the porous insulator layer utilizes exposure to at least one of a diffuse electron beam, ultraviolet (UV) photons, infrared (IR) photons, and a temperature in the range of about 200-450° C.

20. An integrated circuit formed by the method of claim 12, wherein substantially all of the pores within the porous insulator layer contain at least a trace amount of the refractory material, such that the trace amount is detectable but negligible with respect to dielectric constant of the porous insulator layer.

21. An integrated circuit comprising:
   a porous dielectric layer having a plurality of pores, wherein substantially all of the pores within the porous insulator layer contain at least a trace amount of titanium (Ti), titanium nitride (TiN), or titanium dioxide ($TiO_2$), such that the trace amount is detectable but negligible with respect to dielectric constant of the porous dielectric layer; and
   an interconnect formed within the porous dielectric layer.

22. The integrated circuit of claim 21, wherein the porous dielectric layer comprises at least one of silicon dioxide ($SiO_2$), a carbon (C)-doped silicon oxide, a carbosiloxane, a carbosilane, a nitrogen (N)-doped variation of any thereof, and a combination of any one or more of the aforementioned.

23. The integrated circuit of claim 21, wherein the porous dielectric layer has a dielectric constant (κ-value) that is less than or equal to about 2.7.

24. The integrated circuit of claim 21, wherein the interconnect comprises at least one of copper (Cu), cobalt (Co), molybdenum (Mo), rhodium (Rh), beryllium (Be), chromium (Cr), manganese (Mn), aluminum (Al), ruthenium (Ru), palladium (Pd), tungsten (W), nickel (Ni), cobalt tungsten phosphide (CoWP), cobalt tungsten boron (CoWB), copper germanium (CuGe), silicon (Si), and a combination of any one or more thereof.

25. The integrated circuit of claim 21 further comprising a barrier layer formed between the interconnect and the porous dielectric layer, wherein the barrier layer comprises at least one of tantalum (Ta), tantalum nitride (TaN), titanium (Ti), titanium nitride (TiN), manganese (Mn), manganese nitride (MnN), molybdenum (Mo), molybdenum nitride (MoN), cobalt tungsten phosphide (CoWP), cobalt tungsten boron (CoWB), and a combination of any one or more thereof.

* * * * *